United States Patent
Yoon

(10) Patent No.: US 9,798,694 B2
(45) Date of Patent: Oct. 24, 2017

(54) INTERFACE CIRCUIT FOR HIGH SPEED COMMUNICATION, AND SEMICONDUCTOR APPARATUS AND SYSTEM INCLUDING THE SAME

(71) Applicant: SK hynix Inc., Icheon-si, Gyeonggi-do (KR)

(72) Inventor: In Sik Yoon, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 221 days.

(21) Appl. No.: 14/724,303

(22) Filed: May 28, 2015

(65) Prior Publication Data

US 2016/0224506 A1    Aug. 4, 2016

(30) Foreign Application Priority Data

Jan. 29, 2015   (KR) .................. 10-2015-0014439

(51) Int. Cl.
   *G06F 13/42*    (2006.01)
   *G06F 13/364*   (2006.01)
   *G06F 13/40*    (2006.01)
   *G11C 7/22*     (2006.01)

(52) U.S. Cl.
   CPC ........ *G06F 13/4291* (2013.01); *G06F 13/364* (2013.01); *G06F 13/404* (2013.01); *G11C 7/222* (2013.01)

(58) Field of Classification Search
   CPC ... G11C 7/222; G06F 1/04; G06F 1/06; G06F 13/364; G06F 13/404; G06F 13/4291
   USPC ............... 713/400, 500, 600; 710/35, 106
   See application file for complete search history.

(56) References Cited

U.S. PATENT DOCUMENTS

| | | | |
|---|---|---|---|
| 8,181,058 B2* | 5/2012 | Su | H04L 7/0054 327/141 |
| 2011/0142443 A1* | 6/2011 | Hirth | H04J 3/1694 398/25 |
| 2011/0314321 A1 | 12/2011 | Chard et al. | |
| 2012/0045214 A1* | 2/2012 | Lee | H04Q 11/0067 398/98 |

* cited by examiner

*Primary Examiner* — Glenn A Auve
(74) *Attorney, Agent, or Firm* — William Park & Associates Ltd.

(57) ABSTRACT

A semiconductor apparatus may include a burst operation sensing unit and the interface circuit. The burst operation sensing unit may be configured to generate operation mode conversion signals based on current operation state information and a level variation of at least one signal transmission line. The interface circuit may include one or more analog circuits enabled according to the operation mode conversion signals.

19 Claims, 7 Drawing Sheets

611

612

INTERFACE CIRCUIT FOR HIGH SPEED COMMUNICATION, AND SEMICONDUCTOR APPARATUS AND SYSTEM INCLUDING THE SAME

CROSS-REFERENCES TO RELATED APPLICATION

The present application claims priority under 35 U.S.C. §119(a) to Korean application number 10-2015-0014439, filed on Jan. 29, 2015, in the Korean Intellectual Property Office, which is incorporated herein by reference in its entirety.

BACKGROUND

1. Technical Field

Various embodiments generally relate to a communication system, and more particularly, to an interface circuit for high speed communication, and a semiconductor apparatus and a system including the same.

2. Related Art

Electronic products for personal uses, such as a personal computer, a tablet PC, a laptop computer and a smart phone, may be constructed by various electronic components. Two different electronic components in the electronic products may communicate at a high speed to process a large amount of data within a short time. The electronic components may generally communicate through interface circuits. The electronic components may communicate in various schemes, and a serial communication scheme is one example.

As the performances of electronic components are improved, necessity for a communication scheme capable of increasing a bandwidth and reducing power consumption is being increased. In order to meet such necessity, new serial communication schemes are being suggested in various ways, and improved interface circuits to support the new serial communication schemes are being developed.

SUMMARY

In an embodiment, a semiconductor apparatus may include a burst operation sensing unit configured to generate operation mode conversion signals based on current operation state information and a level variation of at least one signal transmission line. An interface circuit may also include one or more analog circuits enabled according to the operation mode conversion signals.

In an embodiment, an interface circuit of a semiconductor apparatus may include a first enable section configured to generate a first enable signal based on current operation state information and a level variation of at least one signal transmission line. The interface circuit may also include a phase-locked loop configured to generate a data clock signal based on the first enable signal. Further, the interface circuit may include a second enable section configured to generate a second enable signal based on the data clock signal, the current operation state information and the level variation of the at least one signal transmission line.

In an embodiment, a system may include a host, and a semiconductor apparatus electrically coupled with the host through at least one signal transmission line. The semiconductor apparatus includes a controller including a burst operation sensing unit which generates first and second enable signals based on current operation state information and a level variation of the at least one signal transmission line, and at least one memory electrically coupled with the controller and configured to store and output data.

DETAILED DESCRIPTION

Hereinafter, an interface circuit for high speed communication, and a semiconductor apparatus and a system including the same will be described below with reference to the accompanying figures through various embodiments.

Embodiments may provide an interface circuit enabling quick operation mode conversion and a semiconductor apparatus including the same, in a system communicating at a high speed.

Figure 1:
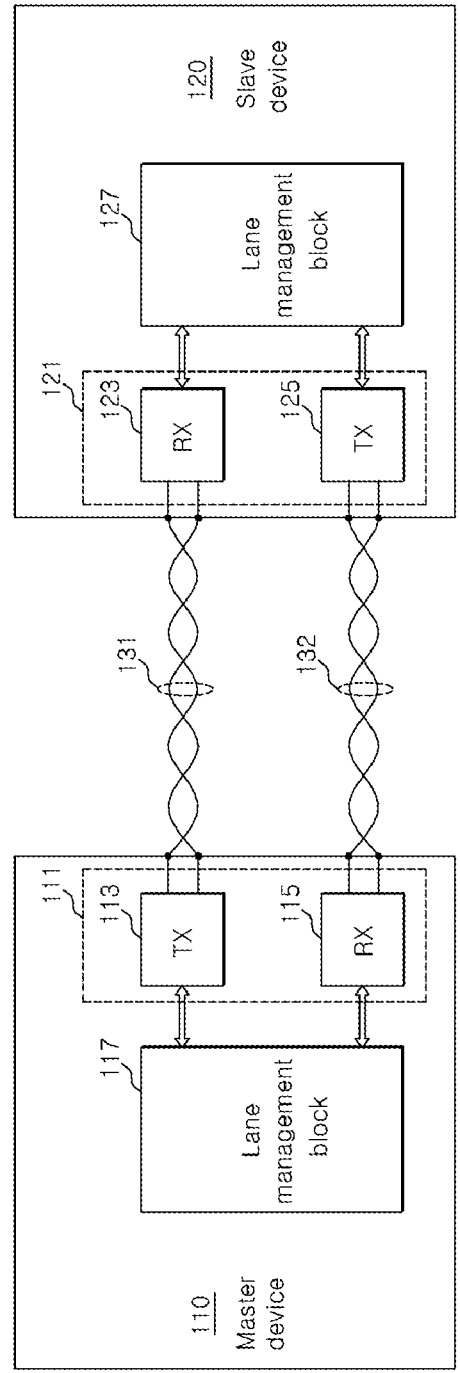
FIG. 1 is a diagram illustrating a representation of an example of the configuration of a system in accordance with an embodiment.

Referring to FIG. 1, a system 1 in accordance with an embodiment may include a master device 110 and a slave device 120. The master device 110 may be a host device which controls the slave device 120. The master device 110 may perform a calculation operation and generate various control signals for controlling the slave device 120. The slave device 120 may perform various operations by being controlled by the master device 110. The master device 110 and the slave device 120 may configure one link. The master device 110 and the slave device 120 may communicate through a sub link. In detail, the master device 110 and the slave device 120 may include interface circuits 111 and 121 to communicate at a high speed. The master device 110 and the slave device 120 may be electrically coupled through signal transmission lines 131 and 132 and exchange signals through the signal transmission lines 131 and 132 and the interface circuits 111 and 121.

The interface circuit 111 and 121 may perform serial communication of a differential signal transmission scheme. The interface circuit 111 of the master device 110 may include a transmitter (TX) 113 for transmitting a signal from the master device 110 to the slave device 120. The interface circuit 111 may also include a receiver (RX) 115 for receiving the signal transmitted from the slave device 120. The interface circuit 121 of the slave device 120 may include a receive (RX) 123 for receiving the signal transmitted from the master device 110. The interface circuit 121 may also include a transmitter (TX) 125 for transmitting a signal to the master device 110. The signal transmission paths 131 and 132 may include a plurality of lanes. Further, each lane may include two signal transmission lines. The two signal transmission lines may transmit a differential signal. While FIG. 1 illustrates an example in which one lane 131 electrically couples the transmitter 113 of the master device 110 and the receiver 123 of the slave device 120 and one lane 132 electrically couples the transmitter 125 of the slave device 120 and the receiver 115 of the master device 110, it is to be noted that the embodiment is not limited to such an example and the system 1 may further include a plurality of lanes for transmission and reception of signals.

The master device 110 and the slave device 120 may further include lane management blocks 117 and 127. The lane management blocks 117 and 127 may perform the functions of dividing signals to be transmitted and mixing received signals when the master device 110 and the slave device 120 exchange signals through the plurality of lanes.

Figure 2:
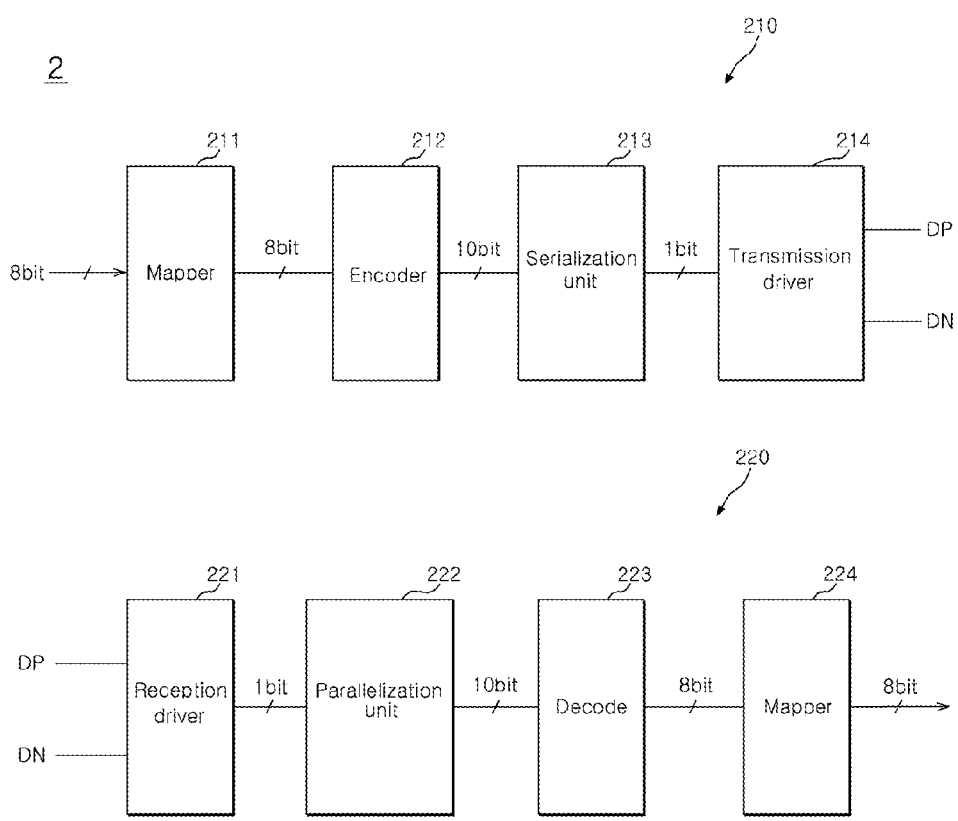
FIG. 2 is a diagram illustrating a representation of an example of the configuration of an interface circuit in accordance with an embodiment.

Referring to FIG. 2, a diagram illustrating a representation of an example of the configuration of an interface circuit 2 in accordance with an embodiment is described. The interface circuit 2 may be applied to the interface circuits 111 and 121 of the master device 110 and the slave device 120 shown in FIG. 1. In FIG. 2, for example, components which may correspond to the transmitter 113 of the master device 110 and the receiver 123 of the slave device 120 are shown. The transmitter 113 may be referred to as an interface circuit 210 of a master device. Further, the receiver 123 may be referred to as an interface circuit 220 of a slave device. The interface circuit 210 of the master device and the interface circuit 220 of the slave device may communicate with each other through two signal transmission lines DP and DN. The two signal transmission lines DP and DN may transmit a differential signal.

The interface circuit 210 of the master device may include a mapper 211, an encoder 212, a serialization unit 213, and a transmission driver 214. The mapper 211 may reconfigure data by adding a control symbol such that the data may be suited to the interface protocol of the system. 8-bit data may be the form of data to be used in the master device and the slave device. The encoder 212 may generate a 10-bit symbol which has a predetermined pattern according to the information of the 8-bit data. For example, the encoder 212 may encode the 8-bit data such that the level of the signal transmitted through the signal transmission lines DP and DN may continuously transition. Since the serial communication scheme between the master device and the slave device does not use a clock signal, a clock signal should be internally generated based on the signal transmitted through the signal transmission lines DP and DN. To precisely generate the clock signal, the signal transmitted through the signal transmission lines DP and DN need to continuously transition.

The serialization unit 213 may serialize the 10-bit encoded symbol outputted from the encoder 212, and sequentially output 1 bit by 1 bit. The transmission driver 214 may output the 10-bit encoded symbol to the signal transmission lines DP and DN through 10 times in response to the outputs of the serialization unit 213. The transmission driver 214 may transmit a differential signal corresponding to 1 bit to the signal transmission lines DP and DN. Accordingly, the 10-bit symbol may be transmitted to the interface circuit 220 of the slave device through 10 times through the transmission driver 214 and the signal transmission lines DP and DN.

The interface circuit 220 of the slave device may include a reception driver 221, a parallelization unit 222, a decoder 223, and a mapper 224. The reception driver 221 may receive the signal transmitted through the signal transmission lines DP and DN from the interface circuit 210 of the master device. The reception driver 221 may differentially amplify the signal transmitted through the signal transmission lines DP and DN, and output a 1-bit signal. The parallelization unit 222 my parallelize the output of the reception driver 221, and output a 10-bit symbol. The decoder 223 may decode the 10-bit symbol, and recover 8-bit data. The mapper 224 may recover the output of the decoder 223 as 8-bit data the same as the 8-bit data inputted to the mapper 211 according to the control symbol added by the mapper 211 of the interface circuit 210 of the master device. While not shown, the interface circuit 220 of the slave device may further include a clock data recovery circuit for generating an internal clock signal based on the signal transmitted through the signal transmission lines DP and DN. The interface circuit 220 may further include a deskewing circuit for correcting the distortion of the signal.

Among the components of the interface circuit 210 of the master device, the mapper 211 and the encoder 212 may be circuits of a digital operation region. Further, the serialization unit 213 and the transmission driver 214 may be circuits of an analog operation region. Among the components of the interface circuit 220 of the slave device, the reception driver 221 and the parallelization unit 222 may be circuits of an analog operation region. In addition, the decoder 223 and the mapper 224 may be circuits of a digital operation region.

Figure 3:
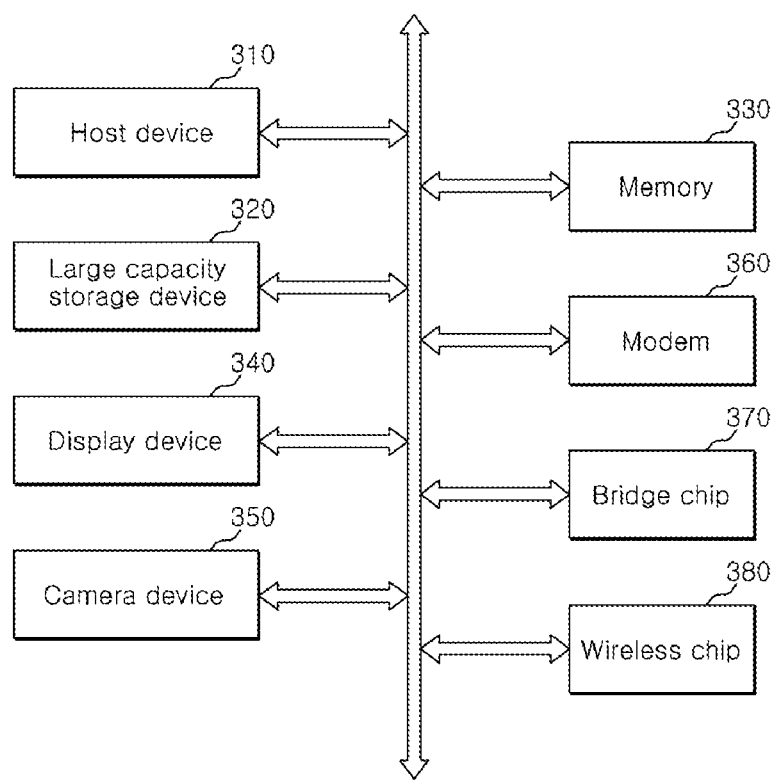
FIG. 3 is a diagram illustrating a representation of an example of a system including electronic components which use the serial communication scheme illustrated in FIGS. 1 and 2.

Referring to FIG. 3, a diagram illustrating a representation of an example of a system including electronic components which use the serial communication scheme illustrated in FIGS. 1 and 2 are described. In FIG. 3, the system 3 may include a host device 310, a large capacity storage device 320, a memory 330, a display device 340, a camera device 350, a modem 360, a bridge chip 370, and a wireless chip 380. The host device 310 may communicate with the remaining components by forming respective individual links.

The host device 310 may include at least one integrated circuit device such as an application processor and an application specific integrated circuit (ASIC). The large capacity storage device 320 may include at least one storage device such as a solid state drive (SSD) and a flash drive through USB coupling. The memory 330 may include any kind of memory device. For example, the memory 330 may include a volatile memory device such as a DRAM (dynamic RAM). In the alternative, the memory 330 may include a nonvolatile memory device such as a ROM (read only memory), a PROM (programmable ROM), an EEPROM (electrically erasable and programmable ROM), an EPROM (electrically programmable ROM), a FLASH memory, a PRAM (phase change RAM), an MRAM (magnetic RAM), an RRAM (resistive RAM) and an FRAM (ferroelectric RAM).

The host device 310 may communicate with the large capacity storage device 320 and the memory 330 by forming respective links. The host device 310, the large capacity storage device 320 and the memory 330 may each include the interface circuit shown in FIGS. 1 and 2, and may exchange signals with one another in a serial communication scheme. Similarly, the host device 310 may communicate serially with the display device 340, the camera device 350, the modem 360, the bridge chip 370 and the wireless chip 380 by forming individual links.

Figure 4:
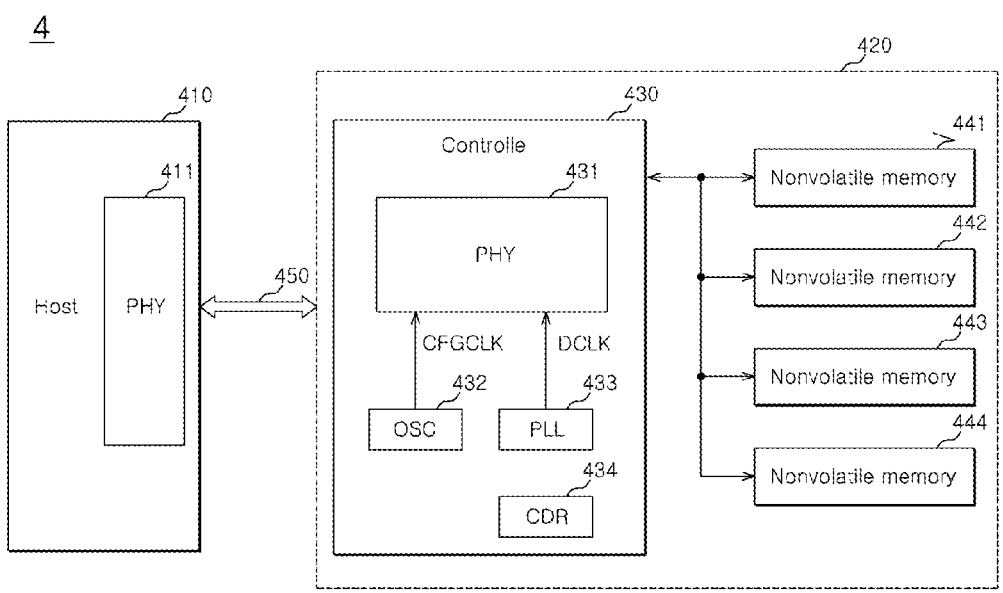
FIG. 4 is a diagram illustrating a representation of an example of the configuration of a system in accordance with an embodiment.

Referring to FIG. 4, a diagram illustrating a representation of an example of the configuration of a system 4 in accordance with an embodiment is described. In FIG. 4, the system 4 may include a host 410 and a semiconductor apparatus 420. The host 410 may be a processor which controls the semiconductor apparatus 420. The host 410 may be electrically coupled with the semiconductor apparatus 420 through at least one signal transmission line 450, and form one link. The at least one signal transmission line 450 may be a signal transmission line pair for transmitting a differential signal, or may include a plurality of signal transmission line pairs for transmitting a plurality of differential signals. The host 410 may include an interface circuit 411 to communicate with the semiconductor apparatus 420 through the at least one signal transmission line 450. The interface circuit 411 may correspond to the interface circuit 210 of the master device shown in FIG. 2. The interface circuit 411 may be a physical layer PHY necessary for signal transmission between the host 410 and the semiconductor apparatus 420.

The semiconductor apparatus 420 may store and output data by being controlled by the host 410. The semiconductor apparatus 420 may be a large capacity storage device such as a solid state drive. The semiconductor apparatus 420 may include a controller 430 and a plurality of nonvolatile memories 441 to 444. The controller 430 may relay the communication between the host 410 and the plurality of nonvolatile memories 441 to 444. The controller 430 may be electrically coupled with the plurality of respective nonvolatile memories 441 to 444. The controller 430 may form individual sub links or channels with the respective nonvolatile memories 441 to 444. In an embodiment, the controller 430 may form individual sub links or channels with at least two nonvolatile memories. The nonvolatile memories 441 to 444 may be the same kind of memories, or may include different kinds of memories. For example, each of the nonvolatile memories 441 to 444 may include a flash memory, a PRAM (phase change RAM), an MRAM (magnetic RAM), an RRAM (resistive RAM) and an FRAM (ferroelectric RAM).

The controller 430 may include an interface circuit 431 to communicate with the host 410 through the at least one signal transmission line 450. The interface circuit 431 may correspond to the interface circuit 220 of the slave device shown in FIG. 2. The interface circuit 431 may be a physical layer PHY necessary for signal transmission between the host 410 and the semiconductor apparatus 420. The interface circuit 431 may convert an operation mode of the semiconductor apparatus 420 based on the signal transmitted through the at least one signal transmission line 450.

The controller 430 may further include an oscillator 432, a phase-locked loop (PLL) 433, and a clock data recovery circuit (CDR) 434. The oscillator 432 may generate a system clock signal CFGCLK with a predetermined cycle, regardless of an operation mode of the semiconductor apparatus 420. The oscillator 432 may generate the system clock signal CFGCLK not only in the state in which the semiconductor apparatus 420 is activated but also in an operation mode in which the semiconductor apparatus 420 consumes minimal power. The operation mode in which the semiconductor apparatus 420 consumes minimal power may be, for example, a slip mode, a power-down mode, a deep power-down mode or a standby mode.

The phase-locked loop 433 may generate a data clock signal DCLK. The data clock signal DCLK may have a shorter cycle and/or a higher frequency when compared to the system clock signal CFGCLK. An amount of current needed for the phase-locked loop 433 to generate the data clock signal DCLK may be substantially large. Therefore, the phase-locked loop 433 may generate the data clock signal DCLK when the semiconductor apparatus 420 is activated. For example, the semiconductor apparatus 420 may be activated in a burst operation mode. Further, the phase-locked loop 433 may generate the data clock signal DCLK in the burst operation mode.

The clock data recovery circuit 434 may change the phase of the data clock signal DCLK. The clock data recovery circuit 434 may change the phase of the data clock signal DCLK based on the signal transmitted through the at least one signal transmission line 450 such that the phase of the data clock signal DCLK corresponds to the phase of the signal transmitted through the at least one signal transmission line 450. The oscillator 432 and the clock data recovery circuit 434 may be circuits of an analog operation region, like the phase-locked loop 433.

Figure 5:
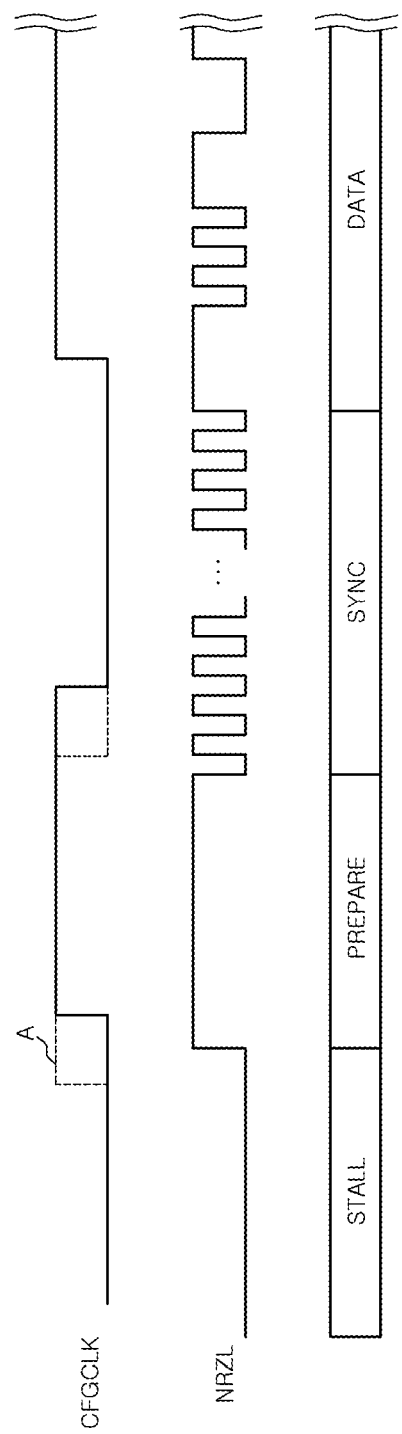
FIG. 5 is a diagram illustrating a representation of an example of various operation modes of the semiconductor apparatus shown in FIG. 4 and operations of the semiconductor apparatus according to the operation modes.

Referring to FIG. 5, a diagram illustrating a representation of an example of various operation modes of the semiconductor apparatus 420 shown in FIG. 4 and operations of the semiconductor apparatus 420 according to the operation modes is described. The semiconductor apparatus 420 may operate in various operation modes. As shown in FIG. 5, the semiconductor apparatus 420 may operate in a stall mode STALL, a prepare mode PREPARE, a sync mode SYNC, and a data mode DATA. The stall mode STALL may be an operation mode in which the semiconductor apparatus 420 consumes minimal power. For example, the stall mode STALL may be a slip mode, a power-down mode, a deep power-down mode or a standby mode. In the stall mode STALL, the semiconductor apparatus 420 may generate the system clock signal CFGCLK through the oscillator 432. Further, the semiconductor apparatus 420 may not transmit or receive data to or from the host 410. In the stall mode STALL, the semiconductor apparatus 420 may enter the burst operation mode by receiving the signal transmitted through at least one signal transmission line NRZL. The at least one signal transmission line NRZL may be a signal transmission line which transmits a positive signal, of a signal transmission line pair for transmitting a differential signal. However, it is to be noted that the embodiment is not limited to such an example and a signal transmission line which transmits a negative signal may be used in such a way as to replace the signal transmission line which transmits a positive signal. In general, the semiconductor apparatus 420 may receive the signal transmitted from the host 410 through the at least one signal transmission line NRZL, by using the system clock signal CFGCLK in the stall mode STALL.

The semiconductor apparatus 420 may receive a signal which instructs entry to the burst operation mode, from the host 410 through the at least one signal transmission line NRZL. For instance, the semiconductor apparatus 420 may enter the burst operation mode by sensing the level variation of the at least one signal transmission line NRZL. The burst operation mode may be an operation mode in which the semiconductor apparatus 420 is activated and the host 410 and the semiconductor apparatus 420 may perform data communication. The semiconductor apparatus 420 may operate in the prepare mode PREPARE as a first step of the burst operation mode. The prepare mode PREPARE may be an operation mode in which the analog circuits included in the semiconductor apparatus 420 may be enabled. In the prepare mode PREPARE, the semiconductor apparatus 420 may enable all circuits belonging to an analog region. Thereafter, the semiconductor apparatus 420 may operate in the sync mode SYNC as a second step of the burst operation mode. The sync mode SYNC may be an operation mode in which the semiconductor apparatus 420 prepares to precisely perform data communication with the host 410. In the sync mode SYNC, the semiconductor apparatus 420 may perform operations of receiving the signal transmitted from the host 410 through the clock data recovery circuit 434 and synchronizing the phases of the signal transmitted through the at least one signal transmission line NRZL and the data clock signal DCLK generated in the phase-locked loop 433. If the phase correction of the data clock signal DCLK is completed as the semiconductor apparatus 420 operates in the sync node SYNC, the semiconductor apparatus 420 operates in the data mode DATA. In the data mode DATA, the semiconductor apparatus 420 may receive the data transmitted from the host 410 or output stored data to the host 410, through the at least one signal transmission line NRZL.

As described above, in general, the semiconductor apparatus 420 may determine whether to enter the burst operation mode, by sensing the level variation of the signal transmitted through the at least one signal transmission line NRZL, by using the system clock signal CFGCLK. For example, at the rising edge of the system clock signal CFGCLK, the level of the at least one signal transmission line NRZL may be sensed. However, where the system clock signal CFGCLK has a phase as indicated by the symbol A, it may not be possible to sense the level variation of the at least one signal transmission line NRZL by using the system clock signal CFGCLK. In this case, the level variation of the at least one signal transmission line NRZL may be sensed not until the next rising edge of the system clock signal CFGCLK, and a time at which the semiconductor apparatus 420 enters the burst operation mode cannot help but be delayed by the cycle of the system clock signal CFGCLK. Accordingly, the interface circuit of the semiconductor apparatus 420 in accordance with the embodiment enables the conversion from the stall mode STALL to the burst operation mode, based on the current operation state information of the semiconductor apparatus 420 and the level variation of the at least one signal transmission line NRZL.

Figure 6:
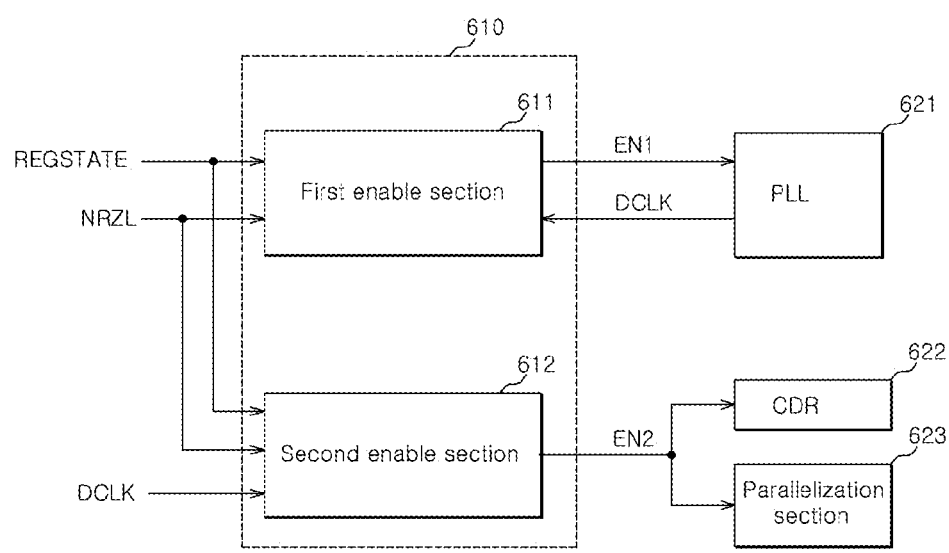
FIG. 6 is a diagram illustrating a representation of an example of the configuration of an interface circuit in accordance with an embodiment.

Referring to FIG. 6, a diagram illustrating a representation of an example of the configuration of an interface circuit 6 in accordance with an embodiment is described. In FIG. 6, the interface circuit 6 may be included in the controller 430 shown in FIG. 4, and be applied as the interface circuit 431. The interface circuit 6 may include a burst operation sensing unit 610 and analog circuits. The burst operation sensing unit 610 may generate operation mode conversion signals based on operation state information REGSTATE and the level variation of at least one signal transmission line NRZL. The analog circuits may be enabled in response to the operation mode conversion signals. The burst operation sensing unit 610 may include first and second enable sections 611 and 612. Further, the operation mode conversion signals may include first and second enable signals EN1 and EN2. The burst operation sensing unit 610 enables the operation mode conversion of a semiconductor apparatus based on the current operation state information REGSTATE of the semiconductor apparatus and the level of the at least one signal transmission line NRZL, regardless of a system clock signal CFGCLK, thereby enabling the quick operation mode conversion of the semiconductor apparatus and improving the reliability of the semiconductor apparatus.

The first enable section 611 may generate the first enable signal EN1 based on the current operation state information REGSTATE and the level variation of the at least one signal transmission line NRZL. The first enable signal EN1 may be used as a signal which enables a phase-locked loop 621 among the analog circuits. The phase-locked loop 621 may generate a data clock signal DCLK when it is enabled based on the first enable signal EN1. The first enable section 611 may retain the enabled state of the first enable signal EN1 based on the data clock signal DCLK, the current operation state information REGSTATE and the level variation of the at least one signal transmission line NRZL.

The second enable section 612 may generate the second enable signal EN2 based on the current operation state information REGSTATE and the level of the at least one signal transmission line NRZL. The second enable signal EN2 may be used as a signal which enables a clock data recovery circuit 622 and a parallelization section 623 among the analog circuits. The second enable section 612 may enable the second enable signal EN2 based on the level variation of the at least one signal transmission line NRZL. The second enable section 612 may retain the enabled state of the second enable signal EN2 based on the data clock signal DCLK, the current operation state information REGSTATE and the level of the at least one signal transmission line NRZL.

Figure 7:
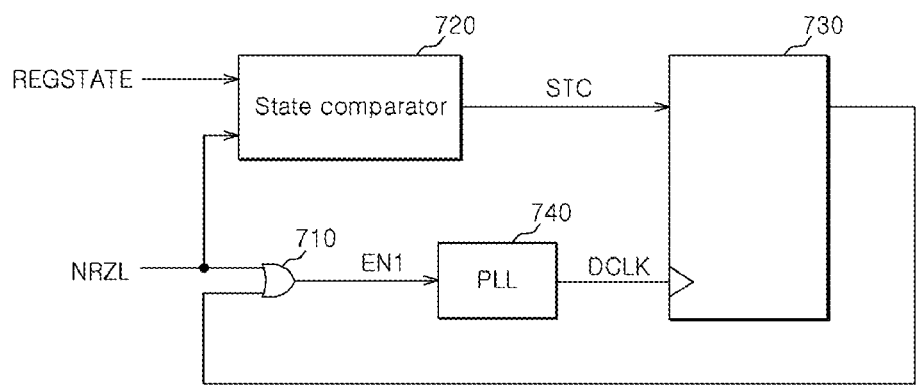
FIG. 7 is a diagram illustrating a representation of an example of the configuration of the first enable section shown in FIG. 6.

Referring to FIG. 7, a diagram illustrating a representation of an example of the configuration of the first enable section 611 shown in FIG. 6 is described. In FIG. 7, the first enable section 611 may include an OR gate 710, a state comparator 720, and a flip-flop 730. The input terminals of the OR gate 710 may be electrically coupled with the at least one signal transmission line NRZL and the flip-flop 730. The OR gate 710 may enable the first enable signal EN1 where the level of the at least one signal transmission line NRZL transitions from a low level to a high level. The state comparator 720 may sense the level variations of the current operation state information REGSTATE and the at least one signal transmission line NRZL. The current operation state information REGSTATE may be information on the various operation modes of the semiconductor apparatus. For instance, the operation state information REGSTATE in the stall mode STALL may be 00, the operation state information REGSTATE in the prepare mode PREPARE may be 01, the operation state information REGSTATE in the sync mode SYNC may be 10, and the operation state information REGSTATE in the data mode DATA may be 11. The state comparator 720 may enable a state comparison signal STC when the current operation state information REGSTATE is 00 corresponding to the stall mode STALL and the level of the at least one signal transmission line NRZL transitions from the low level to the high level.

If the first enable signal EN1 is enabled, the phase-locked loop 740 is enabled and may generate the data clock signal DCLK. The phase-locked loop 740 may be substantially the same component as the phase-locked loop 621 of FIG. 6. If the data clock signal DCLK is generated, the flip-flop 730 may output the enabled state comparison signal STC to the OR gate 710. Further, the OR gate 710 may retain the enabled state of the first enable signal EN1 even though the level of the at least one signal transmission line NRZL varies.

The first enable section 611 causes the first enable signal EN1 to be immediately disabled, if the state comparison signal STC is not enabled even though the level of the at least one signal transmission line NRZL varies and the first enable signal EN1 is enabled. Accordingly, the first enable signal EN1 may be quickly generated according to the level variation of the at least one signal transmission line NRZL. In addition, by retaining the enabled state of the first enable signal EN1 when the state comparison signal STC is enabled, the first enable signal EN1 may be enabled only where the semiconductor apparatus enters the burst mode operation from the stall mode STALL.

Figure 8:
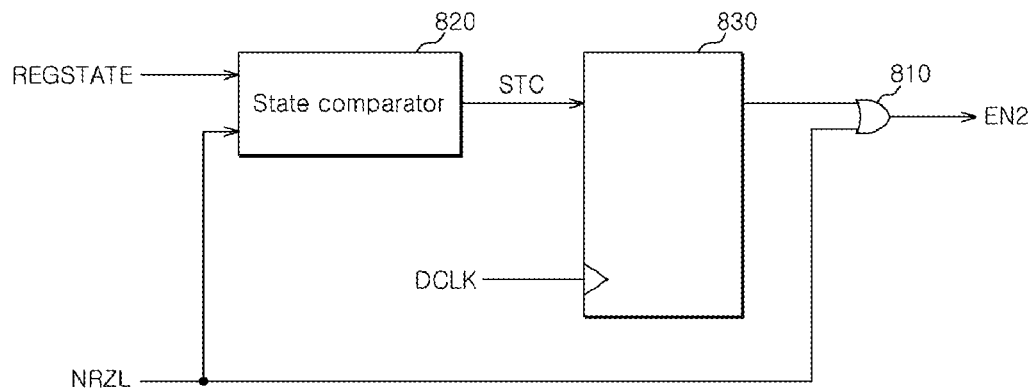
FIG. 8 is a diagram illustrating a representation of an example of the configuration of the second enable section shown in FIG. 6.

Referring to FIG. 8, a diagram illustrating a representation of an example of the configuration of the second enable section 612 shown in FIG. 6 is described. In FIG. 8, the second enable section 612 may include an OR gate 810, a state comparator 820, and a flip-flop 830. The input terminals of the OR gate 810 may be electrically coupled with the at least one signal transmission line NRZL and the flip-flop 830. The OR gate 810 may enable the second enable signal EN2 where the level of the at least one signal transmission line NRZL transitions from the low level to the high level. The state comparator 820 is the same component as the state comparator 720 of FIG. 7. The state comparator 820 may generate a state comparison signal STC in the same manner. The flip-flop 830 may output the state comparison signal STC to the OR gate 810 when the data clock signal DCLK is generated.

The second enable section 612 may quickly enable the second enable signal EN2 when the level of the at least one signal transmission line NRZL varies. In addition, when the state comparison signal STC is enabled, that is, when the semiconductor apparatus enters the burst operation mode from the stall mode STALL, the second enable section 612 may retain the enabled state of the second enable signal EN2.

While various embodiments have been described above, it will be understood to those skilled in the art that the embodiments described are examples only. Accordingly, the interface circuit for high speed communication, and the semiconductor apparatus and the system including the same described herein should not be limited based on the described embodiments above.

What is claimed is:

1. A semiconductor apparatus comprising:
a burst operation sensing unit configured to generate operation mode conversion signals based on current operation state information which corresponds to a first operation mode and a level variation of at least one signal transmission line, wherein the operation mode conversion signals allow the semiconductor apparatus to enter a second operation mode from the first operation mode; and
an interface circuit including one or more analog circuits enabled according to the operation mode conversion signals.

2. The semiconductor apparatus according to claim 1,
wherein the operation mode conversion signals comprise a first enable signal, and
wherein the burst operation sensing unit comprises a first enable section which generates the first enable signal based on the current operation state information and the level variation of the at least one signal transmission line.

3. The semiconductor apparatus according to claim 2, wherein the analog circuits comprise a phase-locked loop which generates a data clock signal in response to the first enable signal.

4. The semiconductor apparatus according to claim 3, wherein the first enable section enables the first enable signal based on the level variation of the at least one signal transmission line, and retains an enabled state of the first enable signal based on a state comparison signal and the data clock signal.

5. The semiconductor apparatus according to claim 4, wherein the state comparison signal is generated based on the current operation state information and the level variation of the at least one signal transmission line.

6. The semiconductor apparatus according to claim 2,
wherein the operation mode conversion signals comprise a second enable signal, and
wherein the burst operation sensing unit comprises a second enable section which enables the second enable signal based on the level variation of the at least one signal transmission line, and retains an enabled state of the second enable signal in response to a state comparison signal and a data clock signal.

7. The semiconductor apparatus according to claim 6, wherein the state comparison signal is generated based on the current operation state information and the level variation of the at least one signal transmission line.

8. The semiconductor apparatus according to claim 6, wherein the one or more analog circuits comprise at least one of a clock data recovery circuit and a parallelization section.

9. A semiconductor apparatus including an interface circuit comprising:
a first enable section configured to generate a first enable signal based on current operation state information and a level variation of at least one signal transmission line;
a phase-locked loop configured to generate a data clock signal based on the first enable signal; and
a second enable section configured to generate a second enable signal based on the data clock signal, the current operation state information and the level variation of the at least one signal transmission line.

10. The semiconductor apparatus according to claim 9, wherein the first enable section enables the first enable signal based on a level of the at least one signal transmission line, and retains an enabled state of the first enable signal based on a state comparison signal generated based on the current operation state information and the level variation of the at least one signal transmission line, and the data clock signal.

11. The semiconductor apparatus according to claim 9, wherein the second enable section enables the second enable signal based on a level of the at least one signal transmission line, and retains an enabled state of the second enable signal based on a state comparison signal generated based on the current operation state information and the level variation of the at least one signal transmission line, and the data clock signal.

12. The semiconductor apparatus according to claim 9, further comprising:
one or more analog circuits configured to be enabled in response to the second enable signal.

13. The semiconductor apparatus according to claim 12, wherein the analog circuits comprise at least one of a clock data recovery circuit and a parallelization section.

14. A system comprising:
a host; and
a semiconductor apparatus electrically coupled with the host through at least one signal transmission line,
the semiconductor apparatus comprising:
a controller including a burst operation sensing unit which generates first and second enable signals based on current operation state information and a level variation of the at least one signal transmission line; and
at least one memory electrically coupled with the controller and configured to store and output data,
wherein the semiconductor apparatus is enabled to enter a burst operation mode according to the current operation state information and the level variation of the least one signal transmission line.

15. The system according to claim 14, wherein the burst operation sensing unit comprises a first enable section which enables a first enable signal based on the level variation of the at least one signal transmission line and retains an enabled state of the first enable signal based on a state comparison signal generated based on the current operation state information and the level variation of the at least one signal transmission line, and a data clock signal.

16. The system according to claim 15, further comprising:
a phase-locked loop configured to generate the data clock signal in response to the first enable signal.

17. The system according to claim 15, wherein the burst operation sensing unit comprises a second enable section which enables a second enable signal based on the level variation of the at least one signal transmission line and retains an enabled state of the second enable signal based on the state comparison signal generated based on the current operation state information and the level variation of the at least one signal transmission line, and the data clock signal.

18. The system according to claim 17, further comprising:
one or more analog circuits configured to be enabled in response to the second enable signal.

19. The system according to claim 18, wherein the one or more analog circuits comprise at least one of a clock data recovery circuit and a parallelization section.

* * * * *